(12) United States Patent  (10) Patent No.: US 8,884,268 B2
Chen et al.  (45) Date of Patent: Nov. 11, 2014

(54) DIFFUSION BARRIER LAYER FOR GROUP III NITRIDE ON SILICON SUBSTRATE

(75) Inventors: Chi-Ming Chen, Zhubei (TW);
Han-Chin Chiu, Kaohsiung (TW);
Chung-Yi Yu, Hsin-Chu (TW);
Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 43 days.

(21) Appl. No.: 13/549,610

(22) Filed: Jul. 16, 2012

(65) Prior Publication Data
US 2014/0014967 A1    Jan. 16, 2014

(51) Int. Cl.
H01L 21/44    (2006.01)

(52) U.S. Cl.
USPC ............... 257/13; 257/94; 257/103; 257/189; 257/E29.081; 257/E33.037

(58) Field of Classification Search
USPC .............. 257/19, 94–103, 189–194, E21.136, 257/403, 29.081, 253, 33.037
See application file for complete search history.

(56) References Cited

U.S. PATENT DOCUMENTS

| | | | |
|---|---|---|---|
| 6,255,198 B1 * | 7/2001 | Linthicum et al. | 438/481 |
| 6,423,984 B1 * | 7/2002 | Kato et al. | 257/103 |
| 6,602,764 B2 * | 8/2003 | Linthicum et al. | 438/481 |
| 6,794,311 B2 * | 9/2004 | Huang et al. | 438/761 |
| 7,153,751 B2 * | 12/2006 | Basceri et al. | 438/396 |
| 7,183,578 B2 * | 2/2007 | Akasaki et al. | 257/79 |
| 7,247,889 B2 * | 7/2007 | Hanson et al. | 257/189 |
| 7,569,870 B2 * | 8/2009 | Yanagihara et al. | 257/192 |
| 7,964,478 B2 * | 6/2011 | Choi et al. | 438/478 |
| 2008/0087914 A1 * | 4/2008 | Li et al. | 257/184 |
| 2008/0315255 A1 | 12/2008 | Maa et al. | |
| 2009/0290610 A1 * | 11/2009 | Eichler et al. | 372/44.01 |
| 2010/0176369 A2 * | 7/2010 | Oliver et al. | 257/13 |
| 2010/0187494 A1 * | 7/2010 | Lee et al. | 257/13 |
| 2011/0089418 A1 * | 4/2011 | Yamamuro et al. | 257/43 |
| 2012/0138945 A1 * | 6/2012 | Chen et al. | 257/76 |
| 2012/0280207 A1 * | 11/2012 | Avramescu et al. | 257/13 |
| 2013/0102140 A1 * | 4/2013 | Derluyn et al. | 438/586 |
| 2013/0105863 A1 * | 5/2013 | Lee et al. | 257/194 |

OTHER PUBLICATIONS

S.Y. Wu, et al., "High-quality thin singl-crystal y-Al2O3 Films Grown on Si (111)", AIP Applied Physics Letters 87, 2005, p. 1-4.

* cited by examiner

*Primary Examiner* — Michael Lebentritt
(74) *Attorney, Agent, or Firm* — Eschweiler & Associates, LLC

(57) ABSTRACT

The present disclosure is directed to an integrated circuit and its formation. In some embodiments, the integrated circuit includes a diffusion barrier layer. The diffusion barrier layer can be arranged to prevent diffusion of the Si and $O_2$ from a Si substrate into a Group III nitride layer. The diffusion barrier layer can comprise $Al_2O_3$. In some embodiments, the integrated circuit further comprises a lattice-matching structure disposed between the silicon substrate and a Group III nitride layer.

20 Claims, 5 Drawing Sheets

US 8,884,268 B2

DIFFUSION BARRIER LAYER FOR GROUP III NITRIDE ON SILICON SUBSTRATE

BACKGROUND

Heteroepitaxy is a kind of epitaxy performed with materials that are different from each other. In heteroepitaxy, a crystalline film grows on a crystalline substrate or film of a different material. This technology is often used to grow crystalline films of materials for which crystals cannot otherwise be obtained and to fabricate integrated crystalline layers of different materials. In particular, Group-III nitrides on silicon heteroepitaxy have recently demonstrated to be a viable alternative for growing high-quality group-III nitride films for optoelectronic, electronic, and surface acoustic wave device applications. Silicon has become the substrate of choice owing to the availability of larger size (up to 12 inch in diameter), low cost, and excellent crystal quality of Si substrates, as well as possessing excellent material properties such as doping properties (amphoteric type and high carrier concentration), cleavability, good thermal conductivity (about 3 times larger than that of sapphire), and mature processing techniques. These advantages of Si substrates provide many novel applications of group-III nitride materials, including the potential integration of GaN and Si technologies.

DETAILED DESCRIPTION

Figure 1A:
FIGS. 1A-1I are partial cross sectional views illustrating steps of forming an embodiment of a semiconductor structure in accordance with the disclosure.
Figure 1A:
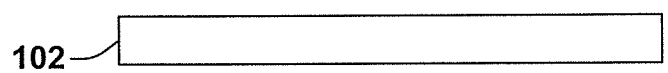

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Group-III nitride semiconductors, for example, GaN (gallium nitride), InN (indium nitride), AlN (aluminum nitride), and their alloys, have become the materials of choice for many optoelectronic applications, especially in the areas of full-color or white light-emitting diodes (LEDs) and blue laser diodes (LDs). However, a major barrier for widespread application of Group III nitrides is lack of suitable lattice-matched substrates for epitaxial growth. Typical substrates for such use include sapphire, silicon gallium arsenide and silicon carbide. Each of these substrates, however, has significant lattice mismatch with respect to the crystal structure of Group-III nitrides. In addition to the lattice mismatch, sapphire has an insulation property which renders the processing of nitride devices more difficult and costly. GaN-on-Si epitaxial technology represents an interesting alternative, which can eventually integrate the existing Si-based microelectronic technology and the novel functionalities provided by the group-III nitrides.

One challenge to the manufacturing of Group III-nitride layers on Si substrates includes the high temperature required for growth of Group III-nitride layers. The solubility of silicon and oxygen ($O_2$) is very high at the III-nitride layer growth temperature (1000° C.+). This can cause molecular species from the Group III-nitride layer to diffuse from the Si substrate material into the Group III-nitride layer. This intermixing is generally referred to as interdiffusion. For example, one or more impurities from the substrate, such as silicon or oxygen, where a silicon substrate is utilized, can interdiffuse into the III-nitride layer. A result is the unintentional doping in the III-nitride layer, resulting in degradation of overall device performance.

Figure 3:
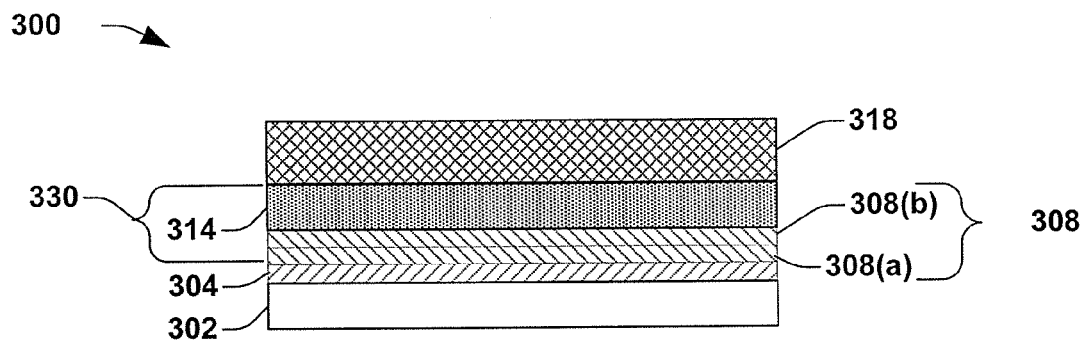
FIG. 3 illustrates an embodiment of a semiconductor structure in accordance with the disclosure.

Accordingly, referring to FIG. 3, the present disclosure is directed to an integrated circuit 300 and its method of fabrication. The integrated circuit 300 includes a diffusion barrier layer 304 overlying a Si substrate 302 having a first lattice structure. The diffusion barrier layer 304 can be arranged to prevent diffusion of the Si and $O_2$ from the Si substrate into a Group III nitride layer 318 having a second lattice structure. In some embodiments the structure further comprises a lattice-matching structure 330 disposed between the silicon substrate 302 and a Group III nitride layer 318 and arranged to interface the first lattice structure of the substrate 302 with the second lattice structure of the Group III nitride layer 318. The lattice matching structure 330 includes a first region 308 and a second region 314. First region 308 includes a first layer 308($a$) of an AlN formed at a first temperature and a second layer 308($b$) of an AlN formed at a second temperature that is higher than the first temperature. Second region 314 includes a plurality of graded $Al_xGa_{1-x}N$ layers.

FIGS. 1A-1I illustrate a plurality of partial cross section diagrams illustrating a manufacturing method forming an integrated circuit 100 according to the disclosure. In FIG. 1A, a substrate 102 having a first lattice structure is provided. When substrate 102 comprises a silicon substrate, it preferably has a (111) surface orientation, although silicon substrates with other surface orientations such as (100) and (110) are also usable. In one embodiment, the substrate is from about 800 nm (nanometers) to about 2000 nm thick.

It will be appreciated that "semiconductor substrate" as referred to herein may comprise any type of semiconductor material including a bulk silicon wafer. Further, the term semiconductor substrate can also encompass structures that include non semiconductor materials such as oxide in silicon-on-insulator (SOI), partial SOI substrate, polysilicon, amorphous silicon, or organic materials, among others. In some embodiments, semiconductor substrates can also include multiple wafers or dies which are stacked or otherwise adhered together. Semiconductor substrates can include wafers which are cut from a silicon ingot, and/or any other type of semiconductor/non-semiconductor and/or deposited or grown (e.g. epitaxial) layers formed on an underlying substrate.

Figure 1B:
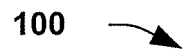
Figure 1B:
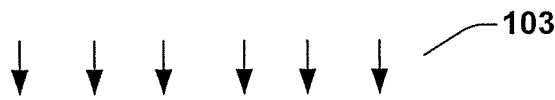
Figure 1B:
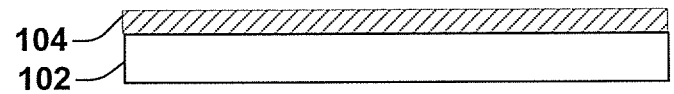

Referring to FIG. 1B, a diffusion barrier layer 104 is deposited 103 overlying the substrate 102. In one embodiment, barrier layer 104 comprises $Al_2O_3$, $Si_xN_y$, ZnO, MgO, $La_2O_3$ or $Y_2O_3$. The barrier layer 104 comprises, in one embodiment, a single crystal alumina ($Al_2O_3$) film, also known as sapphire. The barrier layer 104 can function to prevent the interdiffusion of silicon and oxygen from the silicon substrate into a Group III nitride layer, for example, gallium nitride (GaN), aluminum nitride (AlN), or indium nitride (InN), which will be subsequently formed. The barrier layer 104 can be formed by a number of different methods. For example, in one embodiment the barrier layer is formed by atomic layer deposition (ALD) or molecular beam epitaxy (MBE). In one embodiment utilizing ALD, the temperatures of growth can range from about 200° C. about 400° C., pressures from about 100 torr to about 10 mtorr, and growth times from about 5 minutes up to about 30 minutes.

Figure 1C:
Figure 1C:
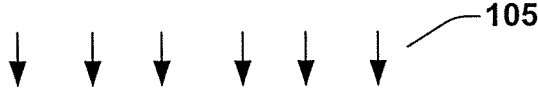
Figure 1C:
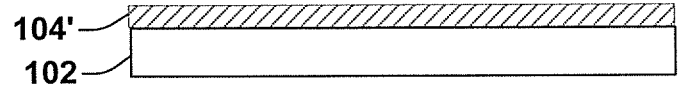

Following deposition of the barrier layer 104, a post deposition annealing process 105 is performed in FIG. 1C. In one embodiment, the post deposition annealing process 105 can be performed at temperatures from about 600° C. to about 1300° C., and in one embodiment at a temperature of about 900° C. Annealing times can range from about 30 seconds to about 1800 seconds, and in one embodiment for about 300 seconds. The process 105 will result in the formation of a single crystal structure of $\alpha$-$Al_2O_3$ or $\gamma$-$Al_2O_3$ 104'.

A lattice-matching structure (130 in FIG. 1F) is then formed between the Si substrate 102 and a subsequently formed group III nitride layer. The lattice matching structure 130 functions as an interface between the Si substrate 102 having a first lattice structure and the group III nitride layer having a second lattice structure that is different from the first lattice structure. Formation of the lattice-matching structure 130 will include, in one embodiment, forming a first region (108 in FIG. 1E) and a second region (114 in FIG. 1F).

Figure 1D:
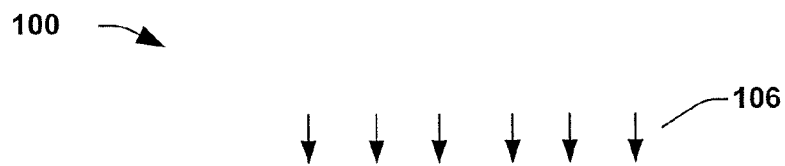

Turning to FIG. 1D, a deposition process 106 is performed to form the first region 108 of the lattice matching-structure. The first region 108 comprises a first layer of AlN which is formed at a first temperature. Thus, in one embodiment, the first layer 108(a) of AlN can be a low temperature AlN (LT-AlN) that can be formed at a temperature of from about 750° C. up to about 1100° C. In one embodiment, the LT-AlN 108(a) will be formed at a thickness of from about 10 nm to about 100 nm, and in another embodiment at a thickness of about 50 nm. The deposition process 106 can include, in one embodiment, a metalorganic chemical vapor deposition (MOCVD) process.

Figure 1E:
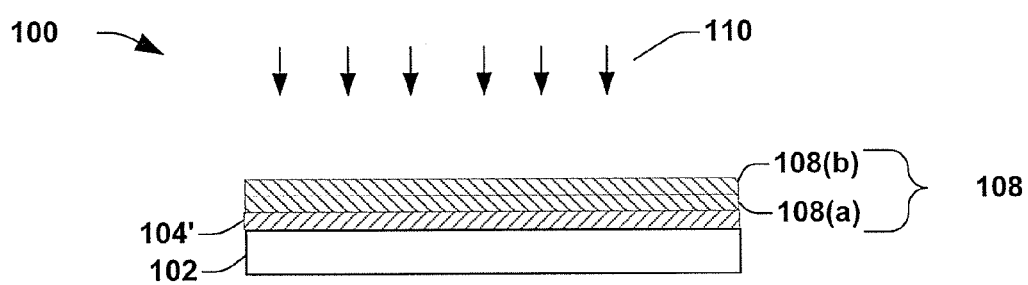

A second layer 108(b) of AlN is then formed by process 110 over first layer 108(a) to complete formation of the first region 108 of the lattice-matching structure, as illustrated in FIG. 1E. The second layer 108(b) of AlN is formed at a second temperature which is higher than the first temperature for formation of the first layer 108(a). Thus, in one embodiment, the second layer of AlN 108(b) can be a high temperature AlN (HT-AlN) that can be formed at a temperature of from about 1000° C. to about 1300° C. and at a thickness of from about 50 nm to about 200 nm in one embodiment, and in another embodiment at a thickness of about 150 nm.

Figure 1F:
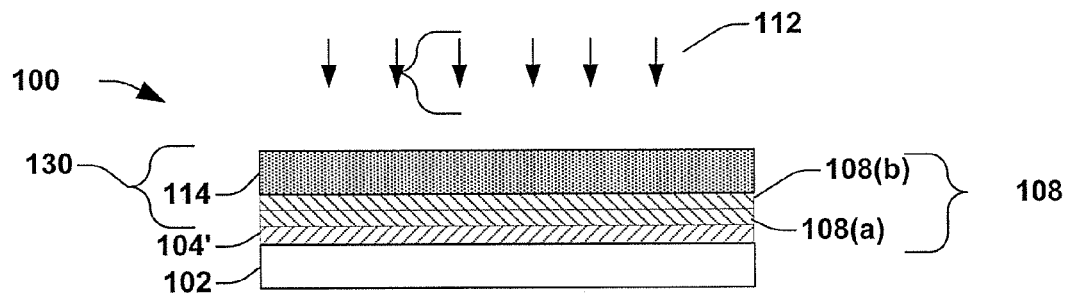

In FIG. 1F, the second region 114 of lattice matching structure is formed by process 112. Second region 114 comprises, in one embodiment, a plurality of graded aluminum-gallium-nitride ($Al_xGa_{1-x}N$) layers. It should be noted that while FIG. 1F illustrates the second region 114 as a single layer, it is contemplated that the second region will be formed from a plurality of layers. The plurality of layers can comprise, in one embodiment, from about three to about six layers. The graded $Al_xGa_{1-x}N$ layers of the second region 114 can have a total thickness of from about 500 nm to about 1000 nm and are deposited by a MOCVD process, for example, at a temperature of from about 1000° C. to about 1200° C.

By "graded" $Al_xGa_{1-x}N$ layers, it is meant that the relative amounts of the respective aluminum content will change with depth in the layers throughout the total thickness of the layers. The relative amounts may change so as gradually to reduce the lattice parameter with distance from the silicon substrate, such that there will be a gradual variation in the relative concentrations. Thus, in one embodiment, where three $Al_xGa_{1-x}N$ layers will be utilized, in a first layer x can comprise from about 0.9 to about 0.7. In a second $Al_xGa_{1-x}N$ layer, x can comprise from about 0.4 to about 0.6, and in a third $Al_xGa_{1-x}N$ layer, x can comprise from about 0.15 to 0.3.

Figure 1G:
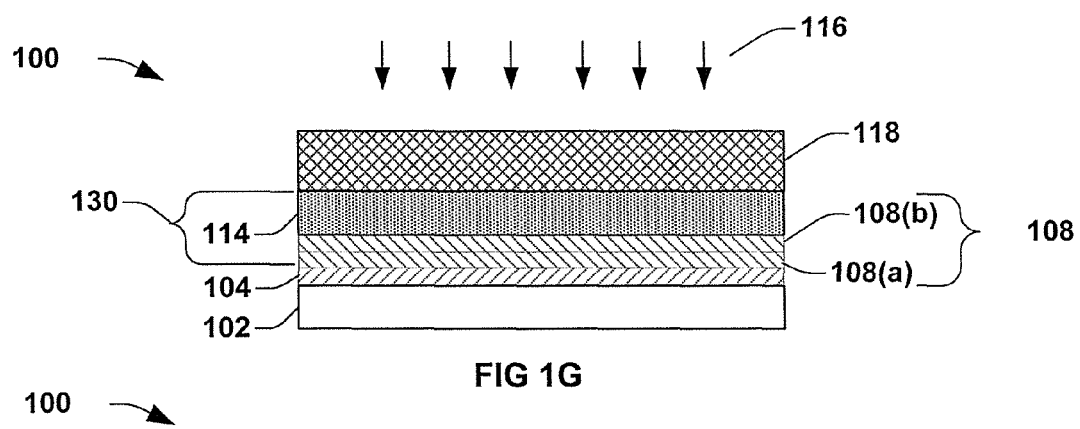

In FIG. 1G, a Group III nitride layer 118 is then formed by a deposition process 116, such as MOCVD in one embodiment, overlying the second region 114 of the lattice matching structure 130. The second Group III nitride layer 118 will comprise, in one embodiment, a GaN layer. The second group III nitride layer 118 can be formed at temperatures of from about 1000° C. to about 1200° C., and at a thickness of from about 1 µm to about 3 µm, in one embodiment.

Figure 1H:
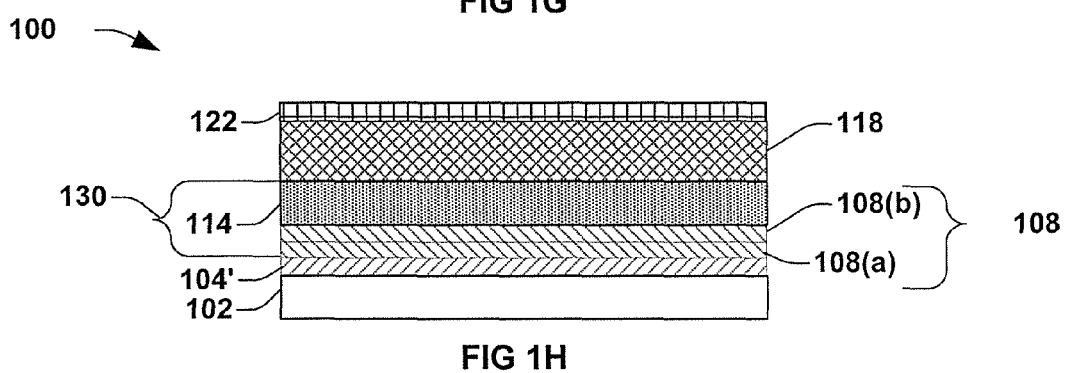

An active layer 122 can then be formed by process (not shown) overlying the Group III nitride layer 118, as illustrated in FIG. 1H. The active layer 122 can comprise, for example, an AlN/AlGaN layer. The active layer 118 can be formed at a thickness, in one embodiment, of from about 10 nm to about 40 nm.

Figure 1I:
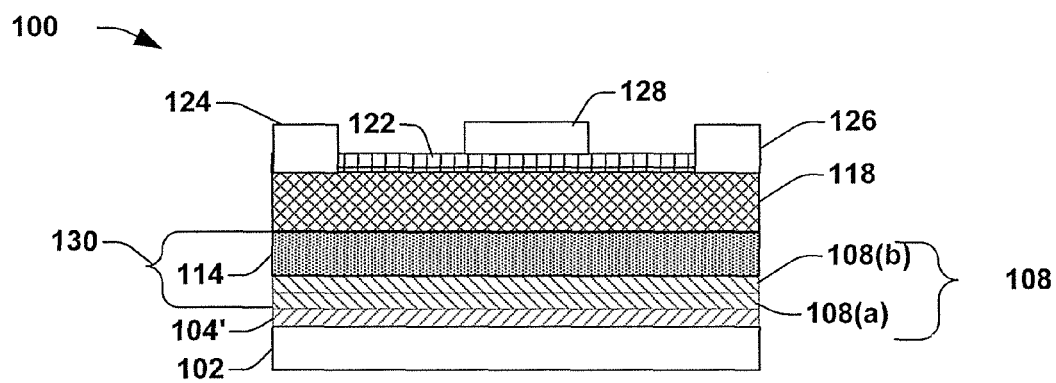

FIG. 1I illustrates formation of a high electron mobility transistor device (HEMT), in which an integrated circuit 100 disclosed herein may be utilized. A gate region 128 can be formed using photolithography or e-beam lithography processes. The source region 124 metal contacts and drain region 126 metal contacts are formed. This can be accomplished generally by one or more processes, including photolithography or e-beam metal deposition processes. Materials of the source 124 and drain 126 region are generally annealed after formation.

Figure 2:
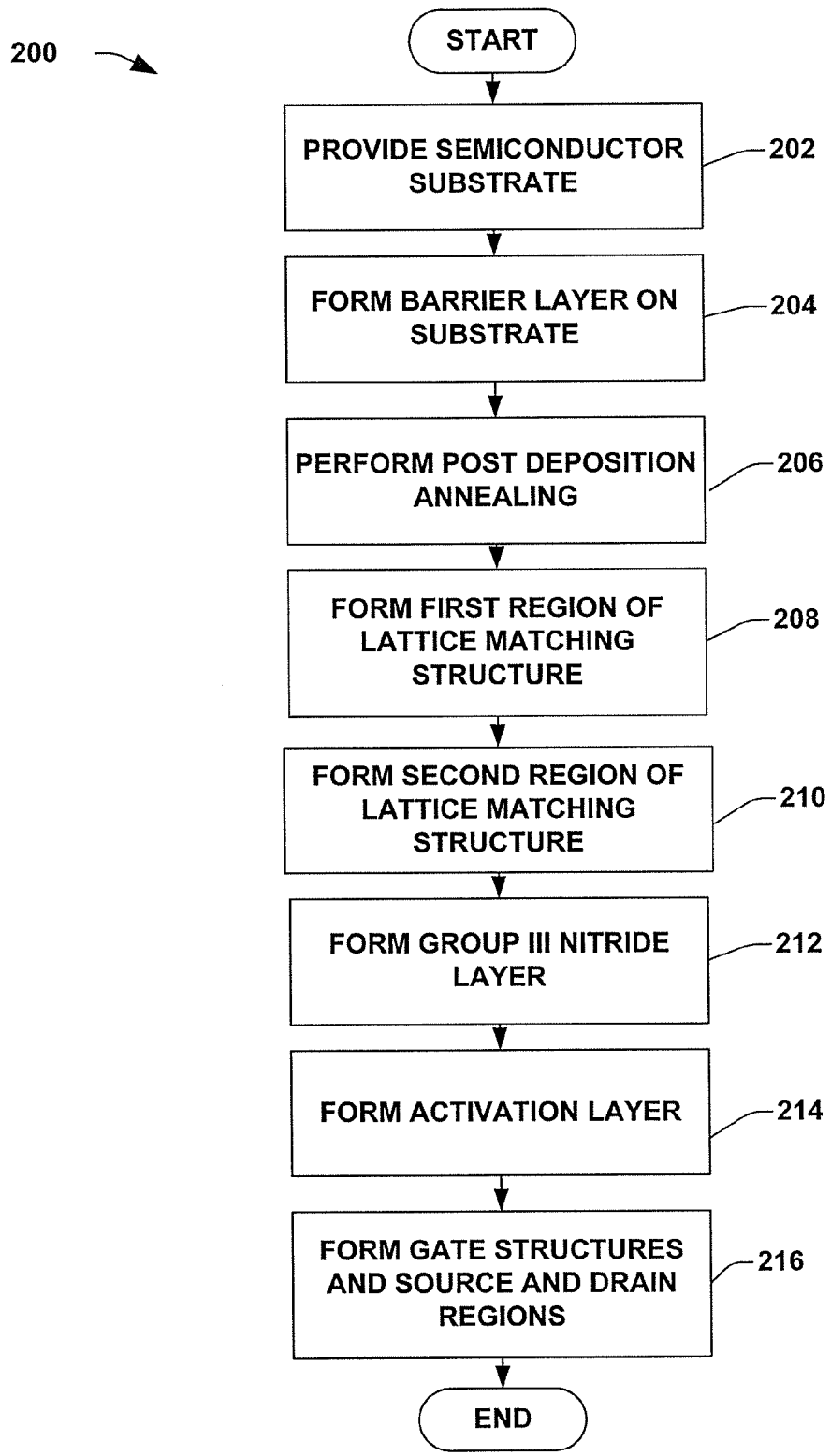
FIG. 2 illustrates a flow diagram of some embodiments of a method for the fabrication of a semiconductor structure in accordance with the disclosure.

FIG. 2 illustrates a flow diagram of some embodiments of a method 200 for formation of a semiconductor structure according to an embodiment of the invention. While method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 202 a silicon substrate is provided. A diffusion barrier layer is then formed over the substrate at step 204.

At step 206, a post-deposition annealing (PDA) of the diffusion barrier layer is performed to form a single crystal structure of $\alpha$-$Al_2O_3$ or $\gamma$-$Al_2O_3$.

At 208, a first region of a lattice-matching structure overlying the diffusion barrier layer is formed by forming a first AlN layer, followed by forming a second AlN layer overlying the first AlN layer.

At step 210, the second region of the lattice-matching structure overlying the first region is formed by forming a plurality of $Al_xGa_{1-x}N$ layers.

At step 212, a group III nitride layer is formed overlying the second region of the lattice-matching structure. An activation layer is then formed overlying group III nitride layer at step 214.

Source and drain regions and a gate structure are then formed at step 216. Interconnect layers can also be formed to interconnect the devices, as can other process steps, although these steps are omitted for simplicity. The method then ends.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to an integrated circuit comprising a silicon substrate having a first lattice structure. The integrated circuit further comprises a GaN layer disposed over the silicon substrate and having a second lattice structure that differs from the first lattice structure. The integrated circuit further comprises a lattice-matching structure arranged between the silicon substrate and the GaN layer and arranged to interface the first lattice structure to the second lattice structure. The integrated circuit further includes diffusion-barrier layer arranged between the silicon substrate and the lattice matching structure, the diffusion-barrier layer configured to limit diffusion of silicon or oxygen from the silicon substrate to the lattice matching structure.

In another embodiment, the disclosure relates to a method for forming a semiconductor structure comprising providing a silicon substrate and forming a diffusion barrier layer overlying the silicon substrate, the diffusion barrier layer configured to prevent silicon and oxygen of the silicon substrate from diffusing through the diffusion barrier layer. The method further comprises forming a lattice-matching structure between the diffusion barrier layer and a group III nitride layer. The method further includes forming the group III nitride layer over the lattice-matching structure.

What is claimed is:

1. An integrated circuit comprising:
a silicon substrate having a first lattice structure;
a GaN layer disposed over the silicon substrate and having a second lattice structure that differs from the first lattice structure;
a lattice-matching structure arranged between the silicon substrate and the GaN layer and arranged to interface the first lattice structure to the second lattice structure; and
a diffusion-barrier layer arranged between the silicon substrate and the lattice matching structure, the diffusion-barrier layer configured to limit diffusion of silicon and oxygen from the silicon substrate to the lattice matching structure,
wherein the diffusion-barrier layer comprises metal oxide or $Si_xN_y$.

2. The integrated circuit of claim 1, wherein the diffusion-barrier layer comprises a single crystal alpha or gamma crystal structure.

3. The integrated circuit of claim 1, wherein the diffusion-barrier layer comprises $Al_2O_3$, $Si_xN_y$, ZnO, MgO, $La_2O_3$, or $Y_2O_3$.

4. The integrated circuit of claim 1, wherein the silicon substrate is Si(111).

5. The integrated circuit of claim 1, wherein the lattice matching structure comprises a first region and a second region.

6. The integrated circuit of claim 5, wherein the first region of the lattice matching structure comprises a first layer of an aluminum nitride formed at a first temperature and a second layer of an aluminum nitride formed at second temperature higher than the first temperature.

7. The integrated circuit of claim 6, wherein the thickness of the first aluminum nitride layer is from about 10 nm to about 100 nm and the thickness of the second aluminum nitride layer is from about 50 nm to about 200 nm.

8. The integrated circuit of claim 5, wherein the second region of the lattice matching structure comprises a plurality of graded $Al_xGa_{1-x}N$ layers.

9. The integrated circuit of claim 8, wherein the plurality of graded $Al_xGa_{1-x}N$ layers comprises from about 3 to about 6 layers and the total thickness of the layers is from about 500 to about 1000 nm.

10. The integrated circuit of claim 8, wherein the plurality of graded $Al_xGa_{1-x}N$ layers comprises at least three layers, and x comprises from about 0.9 to about 0.7 in a first layer, x comprises from about 0.4 to about 0.6 in a second layer, and x comprises from about 0.15 to about 0.3 in a third layer.

11. The integrated circuit of claim 1, wherein the thickness of the GaN layer comprises from about 1 µm to about 3 µm.

12. An integrated circuit comprising:
a silicon substrate having a first lattice structure;
a Group III nitride layer disposed over the silicon substrate and having a second lattice structure that differs from the first lattice structure;
a lattice-matching structure arranged between the silicon substrate and the Group III nitride layer and arranged to interface the first lattice structure to the second lattice structure; and
a diffusion barrier layer arranged between the silicon substrate and the lattice matching structure;
wherein the diffusion barrier layer comprises metal oxide or $Si_xN_y$.

13. The integrated circuit of claim 12, wherein the Group III nitride layer comprises a GaN layer.

14. The integrated circuit of claim 12, wherein the diffusion barrier layer is configured to limit diffusion of silicon and oxygen from the silicon substrate to the lattice matching structure.

15. The integrated circuit of claim 14, wherein the diffusion barrier layer comprises a single crystal alpha or gamma crystal structure.

16. The integrated circuit of claim 14, wherein the diffusion barrier layer comprises $Al_2O_3$, $Si_xN_y$, ZnO, MgO, $La_2O_3$, or $Y_2O_3$.

17. The integrated circuit of claim 12, wherein the lattice matching structure comprises a first region and a second region, wherein the first region is disposed between the silicon substrate and the second region, and wherein the second region is disposed between the first region and the Group III nitride layer.

18. The integrated circuit of claim 17, wherein the first region of the lattice matching structure comprises a first layer of an aluminum nitride formed at a first temperature and a second layer of an aluminum nitride formed at second temperature higher than the first temperature.

19. The integrated circuit of claim 18, wherein the first layer of the aluminum nitride is disposed between the silicon substrate and the second layer of the aluminum nitride, and the second layer of the aluminum nitride is disposed between the first layer of the aluminum nitride and the second region of the lattice matching structure.

20. The integrated circuit of claim 17, wherein the second region of the lattice matching structure comprises a plurality of graded $Al_xGa_{1-x}N$ layers.

* * * * *